United States Patent
Cova et al.

(10) Patent No.: US 7,366,252 B2
(45) Date of Patent: Apr. 29, 2008

(54) WIDEBAND ENHANCED DIGITAL INJECTION PREDISTORTION SYSTEM AND METHOD

(75) Inventors: Armando Cova, Ladera Ranch, CA (US); Scott Carichner, Rancho Santa Margarita, CA (US)

(73) Assignee: Powerwave Technologies, Inc., Santa Ana, CA (US)

(*) Notice: Subject to any disclaimer, the term of this patent is extended or adjusted under 35 U.S.C. 154(b) by 313 days.

(21) Appl. No.: 11/036,805

(22) Filed: Jan. 14, 2005

(65) Prior Publication Data

US 2005/0157814 A1    Jul. 21, 2005

Related U.S. Application Data

(60) Provisional application No. 60/537,937, filed on Jan. 21, 2004.

(51) Int. Cl.
*H04L 25/49* (2006.01)

(52) U.S. Cl. .................................................. 375/296

(58) Field of Classification Search ............... 375/254, 375/242, 278, 297, 272, 271, 259, 285, 284, 375/279, 296, 295, 316, 377; 455/501, 500, 455/39, 67.13, 67.11, 63.1, 114.3, 114.2, 455/91; 330/148, 268, 274, 273, 263, 262, 330/250; 977/700, 839, 840, 902, 963

See application file for complete search history.

(56) References Cited

U.S. PATENT DOCUMENTS

| | | | |
|---|---|---|---|
| 5,049,832 A | 9/1991 | Cavers | 330/149 |
| 5,732,333 A | 3/1998 | Cox et al. | 455/126 |
| 5,760,646 A | 6/1998 | Belcher et al. | 330/149 |
| 5,867,065 A | 2/1999 | Leyendecker | |
| 5,892,397 A | 4/1999 | Belcher et al. | 330/149 |
| 5,923,712 A | 7/1999 | Leyendecker et al. | 375/297 |
| 6,075,411 A | 6/2000 | Briffa et al. | 330/149 |
| 6,118,335 A | 9/2000 | Nielsen et al. | 330/2 |
| 6,141,390 A | 10/2000 | Cova | 375/297 |
| 6,236,837 B1 | 5/2001 | Midya | 455/63 |
| 6,240,144 B1 | 5/2001 | Ha | 375/297 |
| 6,282,247 B1 | 8/2001 | Shen | 375/285 |
| 6,304,140 B1 | 10/2001 | Thron et al. | 330/149 |
| 6,342,810 B1 | 1/2002 | Wright et al. | 330/51 |
| 6,356,146 B1 | 3/2002 | Wright et al. | 330/2 |
| 6,373,331 B1 | 4/2002 | Smiley et al. | |
| 6,437,644 B1 | 8/2002 | Kenington | 330/149 |
| 6,519,010 B2 | 2/2003 | Twitchell et al. | 348/608 |
| 6,549,067 B1 | 4/2003 | Kenington | 330/52 |
| 6,570,514 B1 | 5/2003 | Velazquez | 341/118 |

(Continued)

*Primary Examiner*—Temesghen Ghebretinsae
(74) *Attorney, Agent, or Firm*—Myers Dawes Andras & Sherman LLP

(57) ABSTRACT

A system for linearizing RF amplifiers employing baseband predistortion techniques provides additive or multiplicative predistortion of the quadrature (I/Q) input signal. The predistorter uses a discrete-time polynomial kernel to model the inverse transfer characteristic of the amplifier, providing separate and simultaneous compensation for nonlinear static distortion, linear dynamic distortion and nonlinear dynamic effects including reactive electrical memory effects. A predistortion controller monitors and compares the amplifier output with the quadrature input signal to compute estimates of the residual output distortion of the amplifier. Output distortion estimates are used to adaptively compute the predistorter parameter values in response to changes in the amplifier's operating conditions. The computed values are used in the predistorter. The predistortion system of the invention may provide broadband linearization of RF amplification circuits including, but not limited to, dynamic load modulation amplifiers.

49 Claims, 9 Drawing Sheets

U.S. PATENT DOCUMENTS

| | | |
|---|---|---|
| 6,587,514 B1 | 7/2003 | Wright et al. ................ 375/296 |
| 6,593,812 B2 | 7/2003 | Sundstrom .................. 330/136 |
| 6,642,786 B1 | 11/2003 | Jin et al. .................... 330/149 |
| 6,680,648 B2 | 1/2004 | Nguyen et al. ............. 330/149 |
| 6,731,168 B2 | 5/2004 | Hedberg et al. ............ 330/149 |
| 6,757,525 B1 | 6/2004 | Ishikawa et al. ......... 455/114.3 |
| 6,765,440 B2 | 7/2004 | Chandrasekaran .......... 330/149 |
| 6,781,537 B1 | 8/2004 | Taraschuk et al. .......... 341/144 |
| 2001/0002930 A1 | 6/2001 | Kates ........................ 381/317 |
| 2001/0007435 A1 | 7/2001 | Ode et al. ................... 330/149 |
| 2001/0054974 A1 | 12/2001 | Wright ....................... 341/144 |
| 2002/0021173 A1 | 2/2002 | Yamamoto et al. ......... 330/149 |
| 2002/0044014 A1 | 4/2002 | Wright et al. .................. 330/2 |
| 2002/0065048 A1 | 5/2002 | Nagatani et al. .............. 455/63 |
| 2002/0079965 A1 | 6/2002 | Maniwa et al. ............. 330/149 |
| 2002/0085647 A1 | 7/2002 | Oishi et al. ................. 375/297 |
| 2002/0097811 A1 | 7/2002 | Kubo et al. ................. 375/296 |
| 2002/0114098 A1 | 8/2002 | Magee et al. ............ 360/77.02 |
| 2002/0171485 A1 | 11/2002 | Cova .......................... 330/149 |
| 2003/0011427 A1 | 1/2003 | Cavers et al. ............... 330/149 |
| 2003/0030487 A1 | 2/2003 | Johnson et al. ................ 330/52 |
| 2003/0104794 A1 | 6/2003 | Yang et al. .................. 455/118 |
| 2003/0146787 A1 | 8/2003 | Hedberg et al. ............ 330/149 |
| 2003/0222712 A1 | 12/2003 | Kim et al. ................... 330/149 |
| 2004/0021516 A1 | 2/2004 | Oishi et al. ................. 330/149 |
| 2004/0108920 A1 | 6/2004 | Yu et al. ..................... 333/203 |
| 2004/0116083 A1 | 6/2004 | Suzuki et al. ............... 455/126 |
| 2004/0130394 A1 | 7/2004 | Mattsson et al. ........... 330/149 |
| 2004/0136470 A1 | 7/2004 | DeBruyn et al. ........... 375/297 |
| 2004/0155707 A1 | 8/2004 | Kim et al. ................... 330/149 |
| 2004/0189378 A1 | 9/2004 | Suzuki et al. ................. 330/52 |

WIDEBAND ENHANCED DIGITAL INJECTION PREDISTORTION SYSTEM AND METHOD

RELATED APPLICATION INFORMATION

The present application claims priority to provisional application Ser. No. 60/537,937 filed Jan. 21, 2004, the disclosure of which is incorporated by reference herein in its entirety.

FIELD OF THE INVENTION

The present invention is directed to predistortion linearization of high efficiency, high power RF amplifiers and related systems and methods.

BACKGROUND, PRIOR ART AND RELATED INFORMATION

Modern wireless communication systems employ spectrally efficient, digitally modulated signals with wide bandwidths and time-varying envelopes. Variations in the envelope magnitude of digital modulations generate distortion components at the output of the transmitter that are caused by the inherent nonlinearity of RF amplification circuits. Amplifier distortion produces a dilation of the spectrum of the input signal ("spectral regrowth") which causes interference to communications in adjacent channels. Adjacent channel interference (ACI) is a highly undesirable phenomenon that is tightly controlled by regulatory organizations (FCC, ETSI, ITU). In addition to spectral regrowth, amplifier nonlinearities produce in-band distortion (i.e. distortion components within the bandwidth of the modulated input signal) which deteriorates the integrity of the transmitted signal and results in high Bit Error Rate (BER) at the receiver end. Nonlinearities in conventional RF amplifiers (Class AB) are relatively minor (distortion approximately 40 dB below the level of the carrier for output back offs (OBO) equal to the peak-to-average power ratio (PAR) of the modulation). The price to pay for such a mild nonlinear behavior is poor efficiency, i.e. limited DC-to-RF power conversion performance. High efficiency amplification is highly desirable since it improves system reliability (longer mean time before failure (MTBF)), simplifies thermal management, reduces amplifier size (lower silicon requirements) and lowers the operational and ownership costs of base stations. High efficiency amplifiers (e.g., Doherty amplifier designs) on the other hand exhibit much more nonlinear behavior than Class AB designs (distortion at or less than 29 dB below the level of the carrier).

One simple method of linearization increases the level of OBO in order to reduce output distortion by extending the linear range of operation of the amplifier. This technique can be successfully applied to enhance the linearity of Class AB amplifiers. Unfortunately it also produces a severe loss in efficiency due to reductions in RF output power resulting from higher OBO levels. High efficiency amplifiers on the other hand cannot typically be linearized by simply increasing OBO and require more sophisticated linearization techniques. A well-established technique uses Cartesian (or polar) feedback to minimize the output distortion of the amplifier. Feedback linearization can be effective for narrow signal bandwidths but has very limited distortion correction capabilities when wide bandwidth operation is required (e.g. multicarrier WCDMA) due to input-output stability restrictions associated to loop dynamics. Therefore, feedback would not be sufficient to linearize wide bandwidth, highly efficient transmitters. Another technique, feed forward, is based on additive post-correction of amplifier distortion, typically employing a dual loop architecture to estimate the output distortion of the amplifier in a first (carrier cancellation) loop and then injecting the distortion estimate, properly phased and scaled, to the output of the "main" amplifier via an RF auxiliary or "error" amplifier in a second (distortion cancellation) loop. Feed forward linearization systems do not suffer from the bandwidth limitations of feedback linearizers and are unconditionally stable.

However, and despite having wide bandwidth distortion correction capabilities, feed forward systems usually have low efficiency due to the DC power consumption of the error amplifier and the presence of lossy delay elements at the output of the main amplifier required for phase alignment of the distortion cancellation loop.

An alternative technique suitable for high linearity and high efficiency amplification is predistortion linearization. Conceptually and as a first order approximation, the predistortion technique linearizes the amplifier by injecting a compensatory distortion component at the input of the amplifier whose phase is opposite (180 degrees out of phase) to that of the amplifier's output distortion and whose amplitude is that of the output distortion divided by the linear gain of the amplifier. Predistortion does not suffer from the stability and severe bandwidth restrictions of feedback linearization systems. It also has the advantage over back off and feed forward linearization that its application in a well designed system does not result in a severe degradation of amplifier efficiency. Due to these inherent advantages, predistortion linearization has been the subject of intense research over the past decade.

Prior approaches to predistortion linearization have primarily focused on the design and implementation of digital LUT (Look Up Table) predistorters given the flexibility, precision and noise immunity advantages that they typically offer in comparison to analog predistorters. In these LUT based systems predistortion is carried out in baseband in either polar or Cartesian coordinates. In polar digital predistortion systems a conversion between Cartesian/polar coordinates is usually necessary due to the fact that the digital input modulation is in quadrature form. The coefficients of the predistorter are adaptively computed and stored in tables indexed by transformations of the input (or output) signal envelopes. Typically such LUT predistorters are intended to only compensate for nonlinear static amplifier distortion, without provisions for the linearization of dynamic nonlinearities in the amplifier. These "static" predistorters are not well suited for high efficiency base station transmitter designs due to the fact that nonlinear dynamic distortion components or "memory effects" constitute a substantial portion of the total output distortion of high power, high efficiency amplifiers. To address this limitation of LUT predistorters nonparametric digital baseband predistorters have been proposed in which multidimensional tables are indexed by dynamic transformations (filtered versions) of the instantaneous input envelope magnitude or power. The main advantage of the multitable technique for nonlinear dynamic distortion compensation is that it does not require the computation of a parametric model of the inverse dynamics of the amplifier. The main disadvantages are large memory requirements for storing the predistortion coefficients and the computational complexity involved in the interpolation of table entries when there is unreliable/insufficient data for system adaptation. Multitable interpolation complexity can be quite substantial, posing a limit to the accuracy and adaptation rate of the predistorter. The accuracy of digital LUT predistorters is also limited by table quantization errors. Quantization errors can severely limit distortion correction in high efficiency, high power transmitters in which wideband dynamic distortion compensation is necessary to meet stringent emissions specifications. A simple way to minimize table quantization error would be to increase table size. This solution is a viable alternative for some applications employing parametric digital LUT predistorters. Unfortunately increasing the number of table entries in multitable designs is prohibitive due to the rapid increase in memory and computational requirements. To improve the accuracy and lower the complexity of LUT predistorters a number of other predistortion systems have been proposed. However, none of these approaches adequately addresses the above problems.

The present invention is directed to overcoming the above noted shortcomings of the prior art and providing a predistortion system suitable for wide bandwidth applications without introducing undue complexity into the system.

SUMMARY OF THE INVENTION

In a first aspect the present invention provides a digital predistorter comprising an input for receiving a digital communication signal comprising a stream of signal samples. A linear dynamic compensation circuit is coupled to the input and provides a linear operation on a plurality of time delayed signal samples. A digital envelope detector is also coupled to the input and provides a stream of discrete digital envelope signal samples corresponding to the input signal samples. A first nonlinear dynamic compensation circuit is coupled to the envelope detector and provides a nonlinear operation on a plurality of delayed envelope signal samples. A second nonlinear dynamics compensation circuit is coupled in a cascade arrangment with the first nonlinear dynamic compensation circuit and provides an autoregressive operation on plural samples of the output of the first nonlinear dynamic compensation circuit. A combiner combines the outputs of the linear dynamics compensation circuit and the second nonlinear dynamics compensation circuit and provides a digital predistortion signal as an output.

In a preferred embodiment the digital predistorter further comprises a nonlinear static compensation circuit, coupled to the envelope detector in parallel with the first nonlinear dynamics compensation circuit, which provides a nonlinear operation on individual digital envelope signal samples. The second nonlinear dynamics compensation circuit is preferably coupled in series with the nonlinear static compensation circuit and performs the autoregressive operation on the combined outputs of the nonlinear static compensation circuit and the first nonlinear dynamics compensation circuit. The linear dynamics compensation circuit preferably comprises a finite impulse response filter. The first nonlinear dynamics compensation circuit preferably comprises a plurality of finite impulse response filters coupled in a parallel configuration. The digital predistorter preferably includes a plurality of multipliers coupled to the envelope detector and the plurality of finite impulse response filters are coupled to respective multiplier outputs and operate on plural higher order envelope samples. In a preferred implementation, the plural finite impulse response filters respectively operate on at least second, third, fourth and fifth order envelope samples. The second nonlinear dynamics compensation circuit preferably comprises an infinite impulse response filter. The nonlinear static compensation circuit preferably comprises a polynomial generator providing a weighted polynomial from each individual envelope sample. The polynomial generator may comprise a plurality of multipliers receiving the individual envelope samples and creating higher order envelope samples, a plurality of circuits providing complex coefficients to the multipliers and a summing circuit for combining the plural weighted higher order envelope samples. The digital predistorter preferably also includes a complex multiplier which is coupled to the input and the output of the second nonlinear dynamics compensation circuit and which multiplies the input samples and the output of the second nonlinear dynamics compensation circuit and provides the multiplied value to the combiner.

According to another aspect the present invention provides a predistortion linearized amplifier system. The predistortion linearized amplifier system comprises an input for receiving a digital communication signal comprising a stream of signal samples and a first signal path coupled to the input. A second signal path comprising a digital predistorter is also coupled to the input. The digital predistorter comprises a linear polynomial predistortion circuit operating on plural delayed samples of the input signal and a nonlinear polynomial predisortion circuit coupled to the input in parallel with the linear polynomial predistortion circuit. The nonlinear polynomial predistortion circuit comprises a finite impulse response filter circuit and infinite impulse response filter coupled in series. The digital predistorter further comprises a combiner for combining the outputs of the linear and nonlinear polynomial predistortion circuits and providing a predistortion signal. An addition circuit is coupled to the first and second signal paths and adds the input signal and the predistortion signal and outputs a predistorted input signal. The predistortion linearized amplifier system further comprises an amplifier receiving and amplifying the predistorted input signal and providing an amplified output signal.

In a preferred embodiment of the predistortion linearized amplifier system a digital to analog converter is coupled between the addition circuit and the amplifier for converting the predistorted input signal from digital to analog form. The linear polynomial predistortion circuit preferably comprises a finite impulse response filter. The nonlinear polynomial predistortion circuit preferably further comprises a digital envelope detector which is coupled to the input and provides a stream of envelope samples to the finite impulse response filter circuit and wherein the finite impulse response filter circuit operates on plural delayed envelope samples with plural complex coefficients. The finite impulse response filter circuit preferably comprises a bank of finite impulse response filters coupled in parallel and operating on plural different orders of the stream of envelope samples. The nonlinear polynomial predistortion circuit may further comprise a static nonlinear polynomial circuit coupled to the envelope detector in parallel with the finite impulse response filter circuit which generates a complex weighted polynomial from individual envelope samples. The nonlinear polynomial predistortion circuit also preferably further comprises a second combiner coupled to and combining the outputs of the finite impulse response filter circuit and static nonlinear polynomial circuit and the infinite impulse response filter is preferably coupled to the output of the second combiner. The nonlinear polynomial predistortion circuit may further comprise a multiplier coupled to the input and the infinite impulse response circuit which multiplies the input signal samples and the output of the infinite impulse response filter and provides the multiplied output to the combiner.

According to another aspect the present invention provides a predistortion linearized amplifier system comprising an input for receiving a digital communication signal comprising a stream of signal samples and a digital predistorter. The digital predistorter comprises a linear polynomial predistortion circuit operating on plural delayed samples of the input signal and a nonlinear polynomial predisortion circuit coupled to the input in parallel with the linear polynomial predistortion circuit. The nonlinear polynomial predistortion circuit comprises a finite impulse response filter circuit and an infinite impulse response filter coupled in series. The digital predistorter further comprises a combiner for combining the outputs of the linear and nonlinear polynomial predistortion circuits and providing a predistorted input signal. An amplifier receives and amplifies the predistorted input signal and provides an amplified output signal.

In a preferred embodiment of the predistortion linearized amplifier system a digital to analog converter is coupled between the digital predistorter and the amplifier for converting the predistorted input signal from digital to analog form. The linear polynomial predistortion circuit preferably comprises a finite impulse response filter. The nonlinear polynomial predistortion circuit preferably further comprises a digital envelope detector coupled to the input and providing a stream of envelope samples to the finite impulse response filter circuit and wherein the finite impulse response filter circuit operates on plural delayed envelope samples with plural complex coefficients. The finite impulse response filter circuit preferably comprises a bank of finite impulse response filters coupled in parallel and operating on plural different orders of the stream of envelope samples. The nonlinear polynomial predistortion circuit may further comprise a static nonlinear polynomial circuit coupled to the envelope detector in parallel with the finite impulse response filter circuit which generates a complex weighted polynomial from individual envelope samples. The nonlinear polynomial predistortion circuit also preferably further comprises a combiner coupled to and combining the outputs of the finite impulse response filter circuit and static nonlinear polynomial circuit and the infinite impulse response filter is preferably coupled to the output of the second combiner. The nonlinear polynomial predistortion circuit may further comprise a multiplier coupled to the input and the infinite impulse response circuit which multiplies the input signal samples and the output of the infinite impulse response filter and provides the multiplied output to the combiner.

According to another aspect the present invention provides an adaptive predistortion linearized amplifier system comprising an input receiving a digital communication signal comprising a stream of signal samples and a polynomial based predistortion circuit receiving and operating on the input signal samples and providing a stream of predistorted input samples. The polynomial based predistortion circuit comprises a first finite impulse response filter employing a first set of adaptive complex coefficients, a second finite impulse response filter circuit employing a second set of adaptive complex coefficients, and an infinite impulse response filter circuit employing a third set of adaptive complex coefficients. The adaptive predistortion linearized amplifier system further comprises a digital to analog converter receiving the predistorted input samples and providing an analog predistorted input signal and an amplifier receiving and amplifying the analog predistorted input signal to provide an output signal. A sampling coupler is coupled to the amplifier output and provides a sampled output signal. An analog to digital converter is coupled to the sampling coupler and provides a digital sampled output signal. An adaptive controller is coupled to receive the digital sampled output signal and to the input to receive the input samples and generates the first, second and third adaptive complex coefficients and provides them to the polynomial based predistortion circuit.

In a preferred embodiment of the adaptive predistortion linearized amplifier system the adaptive controller generates the first, second and third adaptive complex coefficients employing first, second and third polynomial operations on the digital sampled output signal. The adaptive controller may comprise a programmed digital signal processor implementing the first, second and third polynomial operations. The polynomial based predistortion circuit may be coupled in series between the input and the digital to analog converter. Alternatively, the polynomial based predistortion circuit may be coupled in a second signal path between the input and the digital to analog converter in parallel with a first signal path and the first and second signal paths are coupled by a combiner, which may comprise a complex addition circuit. An analog quadrature modulator is preferably coupled between the digital to analog converter and the amplifier input and an analog quadrature demodulator is coupled between the sampling coupler and the analog to digital converter. The adaptive predistortion linearized amplifier system may then preferably further comprise a local oscillator coupled to the analog quadrature modulator and the analog quadrature demodulator for upconverting and downconverting, respectively, the analog signals input to said modulators.

According to another aspect the present invention provides a method for predistorting a communication signal prior to amplification by an RF amplifier. The method comprises receiving a digital communication signal comprising a stream of signal samples and predistorting the digital communication signal employing a discrete-time polynomial model of the inverse transfer characteristic of the amplifier to provide a predistorted communication signal. The polynomial model based predistortion provides separate and simultaneous compensation for nonlinear static distortion, linear dynamic distortion and nonlinear dynamic distortion effects of the amplifier. The method further comprises outputting the predistorted communication signal to be amplified by the amplifier.

In one preferred embodiment of the method for predistorting a communication signal, predistorting the digital communication signal comprises adding a predistortion signal to the stream of input samples to provide the predistorted communication signal. Alternatively, predistorting the digital communication signal may comprise operating on the stream of input samples with plural parallel polynomial operations to provide the predistorted communication signal. The compensation for nonlinear dynamic distortion preferably comprises providing separate compensation for electrical memory effects of the amplifier and thermal memory effects. The compensation for nonlinear dynamic distortion preferably comprises filtering a signal derived from plural input samples employing a finite impulse response filter cascaded with an infinite impulse response filter. The compensation for linear dynamic distortion preferably comprises filtering plural input samples employing a finite impulse response filter. The compensation for nonlinear static distortion preferably comprises performing a polynomial operation on individual input envelope samples.

According to another aspect the present invention provides a method for adaptive predistortion linearization of an RF amplifier system. The method comprises receiving a digital communication signal comprising a stream of signal samples and operating on the input signal samples with a plurality of separate polynomial based operations and providing a stream of predistorted input samples. The polynomial based operations comprise a first finite impulse response filtering operation employing a first set of adaptive complex coefficients, a second finite impulse response filtering operation employing a second set of adaptive complex coefficients, and an infinite impulse response filtering operation employing a third set of adaptive complex coefficients. The method further comprises providing an analog predistorted RF input signal from the predistorted input samples and amplifying the analog predistorted RF input signal to provide an output signal. The method further comprises sampling the amplifier output signal to provide an analog sampled output signal and converting the analog sampled output signal to a digital sampled output signal. The method further comprises generating updated adaptive complex coefficients employing the digital sampled output signal and the input signal samples and employing the updated coefficients for the polynomial based predistortion operations.

In one preferred embodiment of the method for adaptive predistortion linearization of an RF amplifier system, operating on the input signal samples with a plurality of separate polynomial based operations and providing a stream of predistorted input samples comprises adding a predistortion signal to the stream of input samples to provide the stream of predistorted input samples. Alternatively, operating on the input signal samples with a plurality of separate polynomial based operations and providing a stream of predistorted input samples may comprise operating on the stream of input samples with plural parallel polynomial operations to provide the stream of predistorted input samples. The first finite impulse response filtering operation and the infinite impulse response filtering operation are preferably performed in series. The second finite impulse response filtering operation and the infinite impulse response filtering operation may also be performed in series. Operating on the input signal samples with a plurality of separate polynomial based operations preferably further comprises deriving a stream of envelope samples from the input signal samples and operating on the stream of envelope samples. Operating on the input signal samples with a plurality of separate polynomial based operations may further comprise performing a polynomial operation on individual envelope samples.

Further features and advantages of the present invention are set out in the following detailed description.

DETAILED DESCRIPTION OF THE INVENTION

Figure 1A:
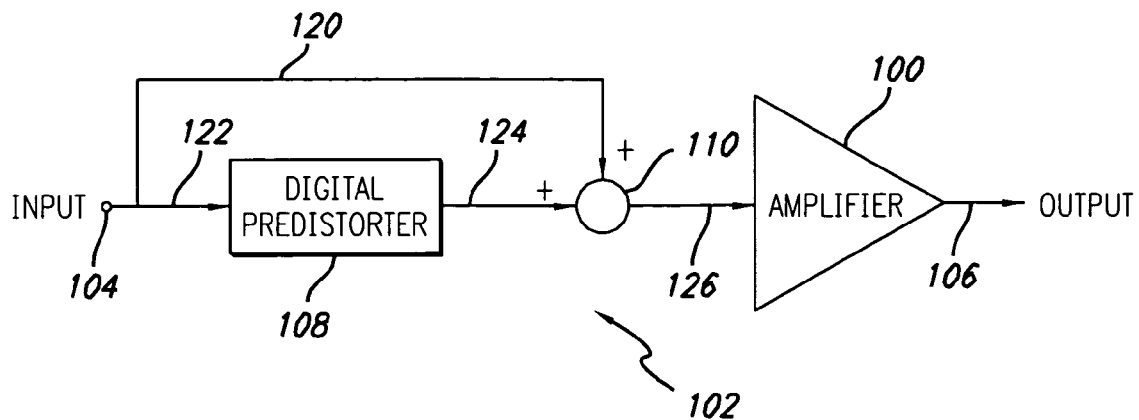
FIG. 1A is a functional block diagram of a predistortion linearized amplifier system using an additive predistortion architecture, in accordance with a preferred embodiment of the present invention.
Figure 1B:
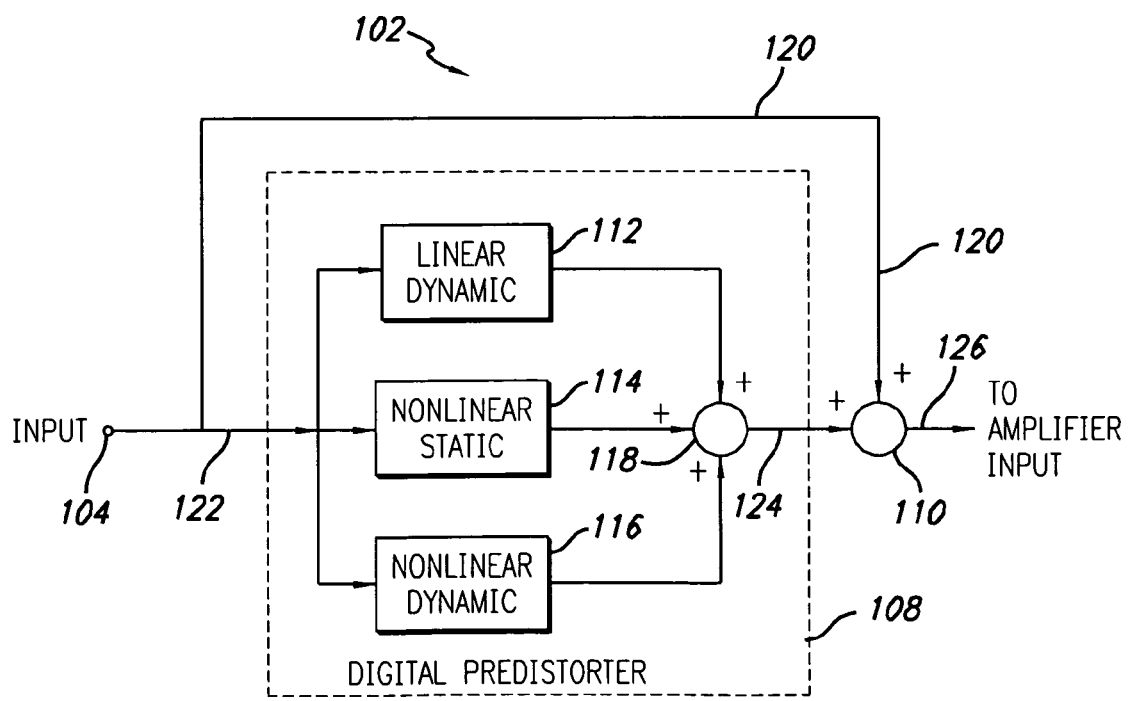
FIG. 1B is a functional block diagram of the predistortion signal path in the additive predistortion architecture of FIG. 1A, in accordance with a preferred embodiment of the present invention.
Figure 2A:
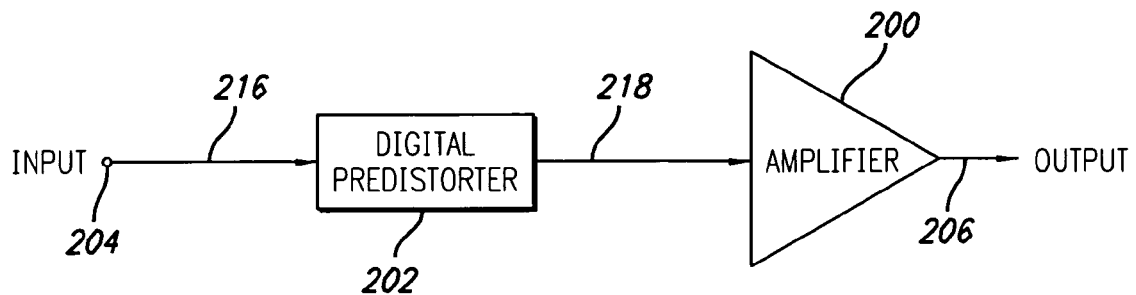
FIG. 2A is a functional block diagram of a predistortion linearized amplifier system using a multiplicative predistortion architecture, in accordance with an alternate embodiment of the present invention.
Figure 2B:
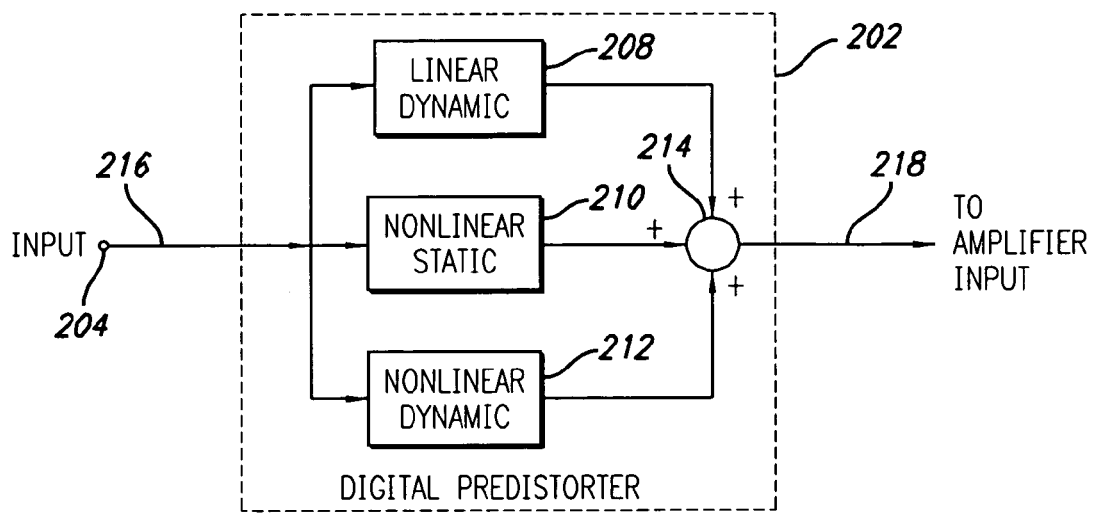
FIG. 2B is a functional block diagram of the predistortion signal path in the multiplicative predistortion architecture of FIG. 2A, in accordance with the alternate embodiment of the present invention.

The present invention provides a digital predistortion system and method with enhanced distortion correction capabilities. The present invention further provides an improved predistortion linearized amplifier system and related method. FIGS. 1A and 1B show an additive predistortion system and predistortion linearized amplifier in accordance with a first embodiment of the present invention in which the distortion compensation signal is added (injected) digitally to the baseband modulation input to form the predistorted signal to drive the amplifier. FIGS. 2A and 2B show a multiplicative predistortion system and predistortion linearized amplifier in accordance with a second embodiment of the present invention in which the digital predistorter acts as a nonlinear operator in cascade with the amplifier.

Referring first to FIG. 1A, the predistortion linearized amplifier system in accordance with a first embodiment of the present invention includes an amplifier 100 which is preferably a high power RF amplifier of a type adapted for wireless communications applications such as cellular base stations. Amplifier 100 may advantageously be designed to have relatively high efficiency. For example, a high efficiency amplifier design employing dynamic load modulation is disclosed in U.S. patent application Ser. No. 10/837,838, filed May 3, 2004, the disclosure of which is incorporated herein by reference in its entirety. Alternatively, amplifier 100 may correspond to a conventional design operated at a lower output back off level for high efficiency. Other designs for amplifier 100 may also be employed. Such efficient amplifier designs may introduce distortion into the amplified signal, however, especially for signal peaks. A digital predistortion system 102 compensates for distortion introduced by amplifier 100 by predistorting an input signal applied to input 104. In particular, input 104 may receive a digital communication signal in the form of a complex quadrature (I,Q) signal comprising a stream of signal samples which may be modulated in any of a variety of modulation schemes well known in the art. For example, the input signal may be a wideband signal such as a WCDMA multi-carrier communication signal. In the additive architecture of FIG. 1A, the digital predistortion system comprises a first signal path 120 coupled to the input 104 and a second signal path comprising a digital predistorter 108 coupled to input 104 via line 122 which operates on the input signal and provides a predistortion signal on line 124. An addition circuit 110 is coupled to the first and second signal paths and injects the predistortion signal into the input signal and outputs a predistorted input signal on line 126. The signal from addition circuit 110 is a baseband predistorted digital signal. Conventional digital to analog conversion circuitry and up conversion circuitry (shown in FIG. 4 and discussed below) convert the predistorted digital signal to a predistorted analog RF signal. The amplifier 100 receives and amplifies the predistorted analog RF signal and provides an amplified RF output signal on line 106 which is substantially free of distortion.

In FIG. 1B the basic architecture of the digital predistortion system 102 is shown. In the illustrated additive architecture the basic predistortion operation on the input signal is performed in the second signal path by digital predistorter 108. The predistorter 108 preferably uses a polynomial model to accurately predistort the amplifier. More specifically, the predistorter preferably uses a discrete-time polynomial kernel to model the inverse transfer characteristic of the amplifier. Accurate predistortion is achieved by providing separate and simultaneous polynomial modeling and compensation for linear dynamic, nonlinear static, and nonlinear dynamic distortion as depicted in the functional diagram of FIG. 1B by blocks 112, 114, and 116, respectively. The linear dynamic block 112 compensates for in-band distortion due to the amplifier 100 (and also in-band distortion due to other active components, including analog quadrature modulation errors, due to the AQM circuitry shown in FIG. 4). The nonlinear static block 114 of the predistorter compensates for distortion due to instantaneous input signal levels, so called memoryless distortion. The nonlinear dynamic block 116 of the predistorter compensates for dynamic distortion which is a function of plural consecutive input signal levels, so called memory effects. This nonlinear dynamic distortion has two general types of contributions having quite different characteristics which can be generally described as short term memory effects which are primarily reactive electrical effects and long term memory effects including thermal memory effects. To effectively model and compensate for these two types of memory effects the nonlinear dynamic block 116 of the predistorter preferably employs separate polynomial models for the two types of memory effects. These are preferably cascaded for computational efficiency and reduced circuit complexity within nonlinear dynamic block 116 as will be discussed in detail below. The compensatory predistortion signal components emerging from the linear dynamic, nonlinear static, and nonlinear dynamic blocks of the predistorter are summed together at combiner 118 to form a unique distortion compensation signal on line 124. This predistortion signal is then added to the input signal at addition circuit 110 as described above. One specific implementation of the digital predistorter 108 is shown in FIG. 3, discussed below.

Referring to FIGS. 2A and 2B a second embodiment of the present invention is illustrated in which the digital predistorter acts as a nonlinear operator in cascade with the input and the amplifier and performs a multiplicative predistortion operation on the input signal. As in the first embodiment of the present invention the predistortion linearized amplifier system includes an amplifier 200 (which may be the same as amplifier 100 and is not described further) which is linearized by digital predistorter 202 acting on a digital input signal provided at input 204. The input signal is provided on line 216 (complex I,Q signal inputs and signal paths are implied) and operated on by a multiplicative predistortion operation to provide a pedistorted input signal on line 218. Digital to analog and up conversion circuits (not shown in FIG. 2A but described in relation to FIG. 5 below) convert the predistorted input signal to an RF signal which is amplified by amplifier 200 to provide a substantially distortion free output RF signal on line 206. In FIG. 2B the architecture of the digital predistorter 202 is illustrated. As in the case of digital predistorter 108 of the first embodiment the digital predistorter 202 provides separate and simultaneous polynomial modeling and compensation for linear dynamic, nonlinear static, and nonlinear dynamic distortion as depicted in the functional diagram of FIG. 2B by blocks 208, 210, and 212, respectively, which are combined at combiner 214 to provide the predistorted input signal on line 218. Due to the flexibility of the multiple polynomial modeling of the predistortion operation the same architecture may be used for the multiplicative embodiment as the additive embodiment of FIGS. 1A and 1B and one specific implementation of the digital predistorter 202 is shown in FIG. 3, discussed below.

Figure 3:
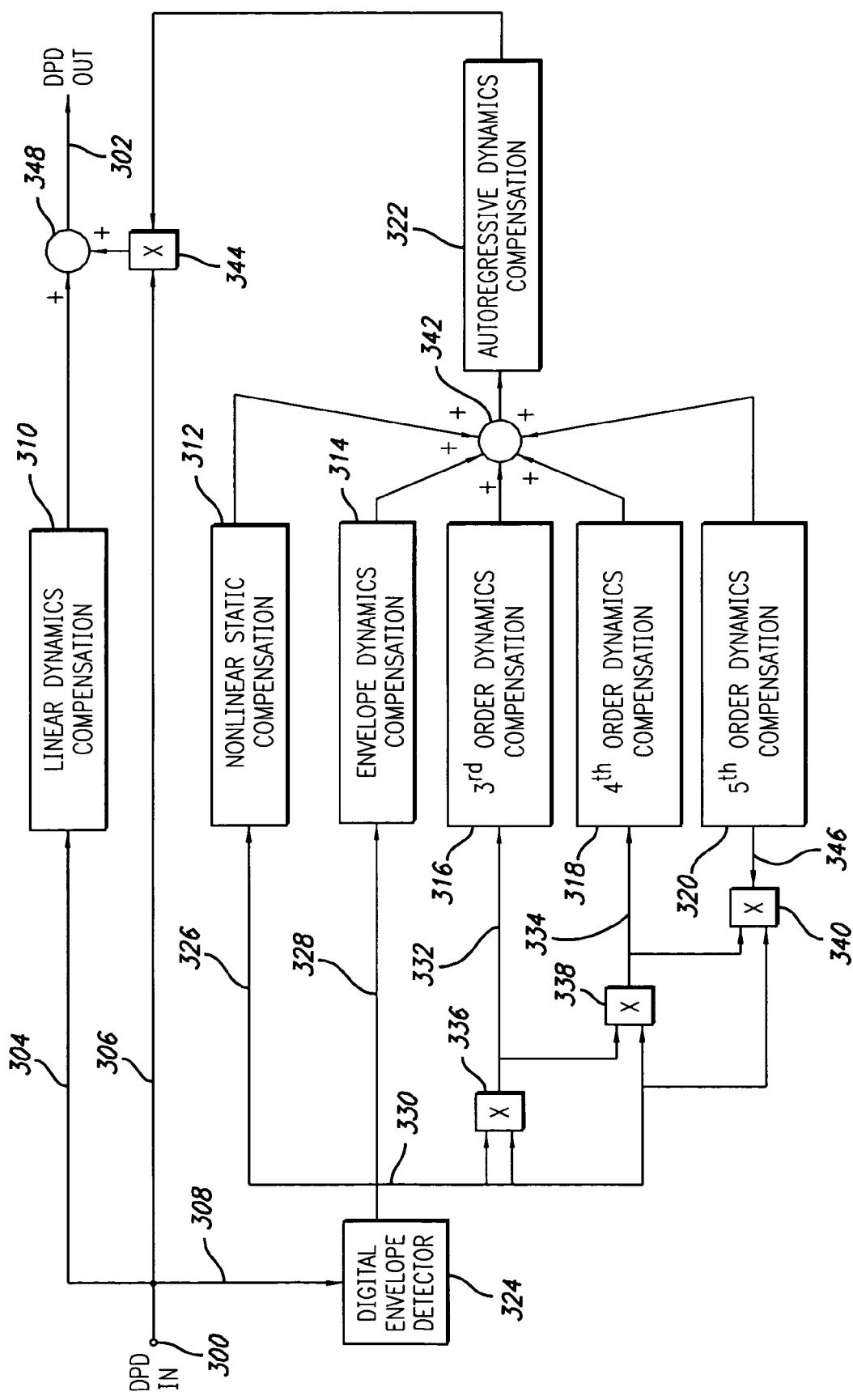
FIG. 3 is a block diagram of a polynomial digital predistorter, in accordance with a preferred embodiment of the present invention.

Referring to FIG. 3 the structure of the digital predistorter (DPD) in accordance with a preferred embodiment of this invention is shown in a block schematic drawing. The input to the digital polynomial predistorter (DPD IN) is provided at input 300. As discussed above this will correspond to a baseband communication signal comprising a stream of signal samples in quadrature (I,Q) format. The stream of input signal samples are provided along signal path 304 to linear dynamics compensation circuit 310. The linear dynamic compensation circuit 310 provides a linear operation on a plurality of time delayed signal samples to model linear dynamic distortion or linear memory effects. More specifically, the linear dynamic operation may be represented by the following polynomial operation:

$$H_1[z] = a_0 + a_1 z^{-1} + a_2 z^{-2} + \ldots + a_{N1} z^{-N1} \quad (1)$$

In equation (1) $H_1[z]$ is the transfer function of the linear dynamics compensation circuit 310, $a_0$-$a_{N1}$ are complex predistortion coefficients and N1 is an integer which determines the number of delayed samples employed to model the memory effects. This polynomial operation is preferably implemented in a digital Finite Impulse Response (FIR) filter and the complex predistortion coefficients are filter coefficients stored in nonvolatile memory within linear dynamics compensation circuit 310.

The stream of input signal samples at DPD input 300 are also provided to nonlinear static and nonlinear dynamics compensation blocks. These generate nonlinear predistortion component signals by performing nonlinear transformations of the magnitude of the envelope of the input signal. More specifically, a digital envelope detector 324 receives the input samples along line 308 and computes envelope samples corresponding to the instantaneous envelope of the input signal. The output envelope samples from the digital envelope detector 324 are provided along line 326 to nonlinear static compensation circuit 312. Nonlinear static compensation circuit 312 provides a nonlinear static polynomial transformation on individual envelope samples output from the digital envelope detector to model nonlinear static (memoryless) distortion. More specifically, the nonlinear operation may be represented by the following polynomial operation:

$$H_2 = \sum_{k=1}^{M} p_k |DPDIN_{env}|^k \tag{2}$$

In equation (2) $H_2$ is the transfer function of the nonlinear static compensation circuit 312, the $p_k$ are complex predistortion coefficients, $DPDIN_{env}$ represents the current envelope sample from the digital envelope detector 324, and M is an integer.

The output envelope samples from the digital envelope detector 324 are also provided to a nonlinear dynamics compensation block which provides a nonlinear operation on a plurality of delayed envelope signal samples to generate a distortion compensation signal in response to variations in envelope magnitude dynamics. The nonlinear dynamics compensation block preferably comprises first and second dynamics compensation circuits in a cascade configuration. The first nonlinear dynamic compensation circuit preferably comprises a bank of parallel polynomial operation circuits 314, 316, 318, 320. Higher order dynamic distortion compensation components are generated by computing different powers of the envelope magnitude with signal multipliers and operating on plural delayed samples of the multiplier's outputs with separately parametrized polynomial operations. This arrangement provides selective compensation for dynamic effects of different orders which are associated to electrical effects such as the video bandwidth of the bias network and the electrical dynamics of the amplifier. (Such sort term electrical based dynamic effects are also referred to herein as reactive memory effects.) Reactive memory effects constitute a significant portion of the total output distortion of the amplifier and must be compensated for to ensure acceptable linearity and efficiency performance.

Specifically, in a preferred implementation envelope dynamics compensation circuit 314 implements the following polynomial operation on plural delayed envelope samples provided on line 328:

$$H_3[z] = b_1 z^{-1} + b_2 z^{-2} + \ldots + b_{N2} z^{-N2} \tag{3}$$

In equation (3) $H_3[z]$ is the transfer function of the envelope dynamics compensation circuit 314, $b_1$-$b_{N2}$ are complex predistortion coefficients and N2 is an integer which determines the number of delayed samples employed to model the memory effects. This polynomial operation is preferably implemented in a digital Finite Impulse Response (FIR) filter and the complex predistortion coefficients are filter coefficients stored in nonvolatile memory within envelope dynamics compensation circuit 314. As shown in FIG. 3 additional higher order memory effect compensation is also provided in parallel with the envelope dynamics compensation circuit 314 by acting on higher order multiples of the envelope samples. In particular, $3^{rd}$ order dynamics compensation circuit 316 operates on a second order envelope sample provided by multiplier 336 and implements the following polynomial operation on plural delayed envelope samples provided on line 332:

$$H_4[z] = c_1 z^{-1} + c_2 z^{-2} + \ldots + c_{N3} z^{-N3} \tag{4}$$

In equation (4) $H_4[z]$ is the transfer function of the $3^{rd}$ order dynamics compensation circuit 316, $c_1$-$c_{N3}$ are complex predistortion coefficients and N3 is an integer which determines the number of delayed samples employed to model the third order memory effects. This polynomial operation is preferably implemented in a digital Finite Impulse Response (FIR) filter and the complex predistortion coefficients are filter coefficients stored in nonvolatile memory within $3^{rd}$ order dynamics compensation circuit 316. Similarly, $4^{rth}$ order dynamics compensation circuit 318 operates on third order envelope samples provided by multiplier 338 and implements the following polynomial operation on plural delayed envelope samples provided on line 334:

$$H_5[z] = d_1 z^{-1} + d_2 z^{-2} + \ldots + d_{N4} z^{-N4} \tag{5}$$

and 5th order dynamics compensation circuit 320 operates on fourth order envelope samples provided by multiplier 336 and implements the following polynomial operation on plural delayed envelope samples provided on line 346:

$$H_6[z] = e_1 z^{-1} + e_2 z^{-2} + \ldots + e_{N5} z^{-N5} \tag{6}$$

In equations (5) and (6) $H_5[z]$ and $H_6[z]$ are the transfer functions of circuits 318 and 320, $d_1$-$d_{N4}$ and $e_1$-$e_{N5}$ are complex predistortion coefficients and N4 and N5 are integers which determine the number of delayed samples employed to model the $4^{th}$ and $5^{th}$ order memory effects. These polynomial operations are preferably implemented in digital Finite Impulse Response (FIR) filters and the complex predistortion coefficients are filter coefficients stored in nonvolatile memory within dynamics compensation circuits 318 and 320.

Still referring to FIG. 3, second nonlinear dynamics compensation circuit 322 is cascaded with the first nonlinear dynamics compensation circuit and implements an autoregressive dynamics compensation operation. The autoregressive dynamics compensation operation cancels the distortion due to thermal drifts and long-term dynamics in the amplifier. To reduce circuit complexity the second nonlinear dynamics compensation circuit 322 is preferably coupled in a cascade arrangement with the combined outputs of the plural parallel dynamic memory compensation circuits 314, 316, 318, 320 as well as the nonlinear static compensation circuit 312. The outputs of these circuits are summed together at combiner 342 and the output of combiner 342 is provided to the second nonlinear dynamics compensation circuit 322 which implements the autoregressive dynamics compensation operation using an infinite impulse response (IIR) digital filter. Specifically, the following operation may be implemented using an all pole IIR filter:

$$H_7[z] = \frac{1}{g_0 + g_1 z^{-1} + g_2 z^{-2} + \ldots + g_{N6} z^{-N6}} \tag{7}$$

More generally, the following operation may be implemented in circuit 322 using an IIR filter:

$$H_8[z] = \frac{b_1 z^{-1} + b_2 z^{-2} + \ldots + b_{N7} z^{-N7}}{g_0 + g_1 z^{-1} + g_2 z^{-2} + \ldots + g_{N8} z^{-N8}} \tag{8}$$

In equations (7) and (8), $H_7[z]$ and $H_8[z]$ are the transfer function of circuit 322, $b_N$ and $g_N$ are complex filter coefficients and N6, N7 and N8 are integers.

The output of the autoregressive dynamics compensation circuit 322 is used to modulate the I,Q baseband input signal provided on line 306 at multiplier 344. This modulated signal is added to the output of the linear dynamics compensation circuit 310 at addition circuit 348 to form the DPD output which is provided on line 302.

Figure 7:
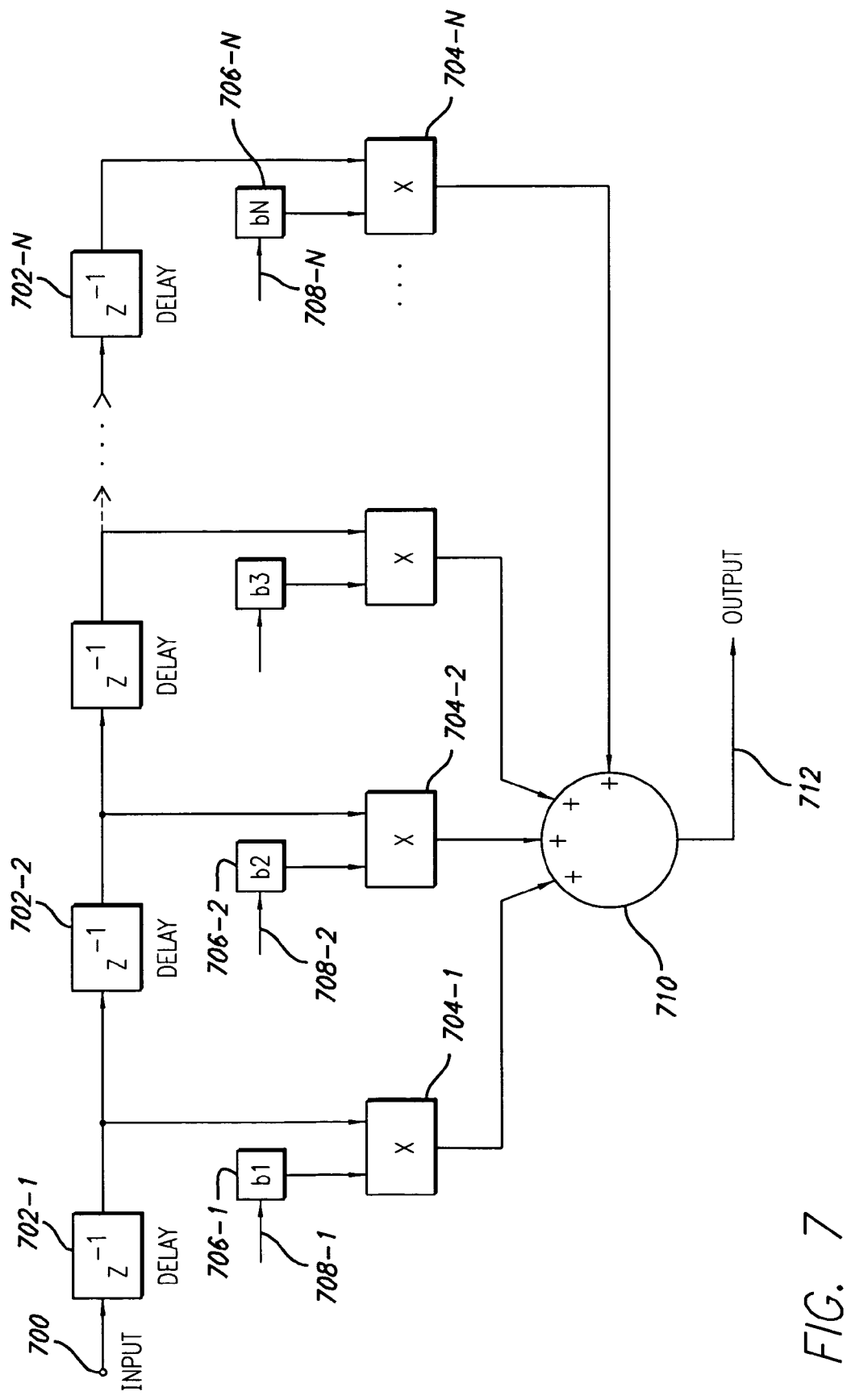
FIG. 7 is a schematic diagram of a FIR filter employed in the linear and nonlinear dynamics compensation blocks of the digital predistorter of FIG. 3, in accordance with a preferred embodiment of the present invention.
Figure 8:
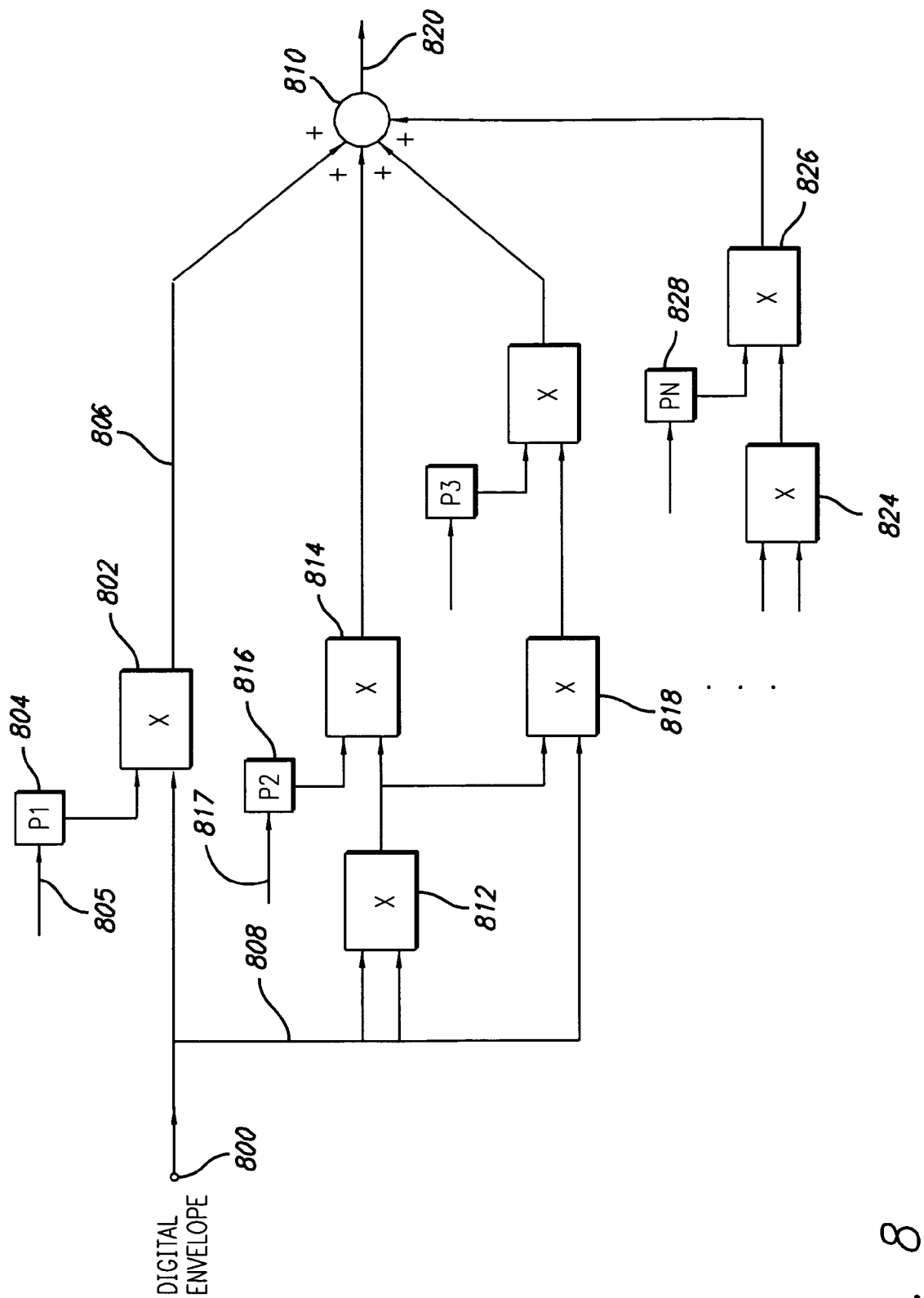
FIG. 8 is a schematic diagram of a polynomial generator circuit employed in the nonlinear static compensation block of the digital predistorter of FIG. 3, in accordance with a preferred embodiment of the present invention.
Figure 9:
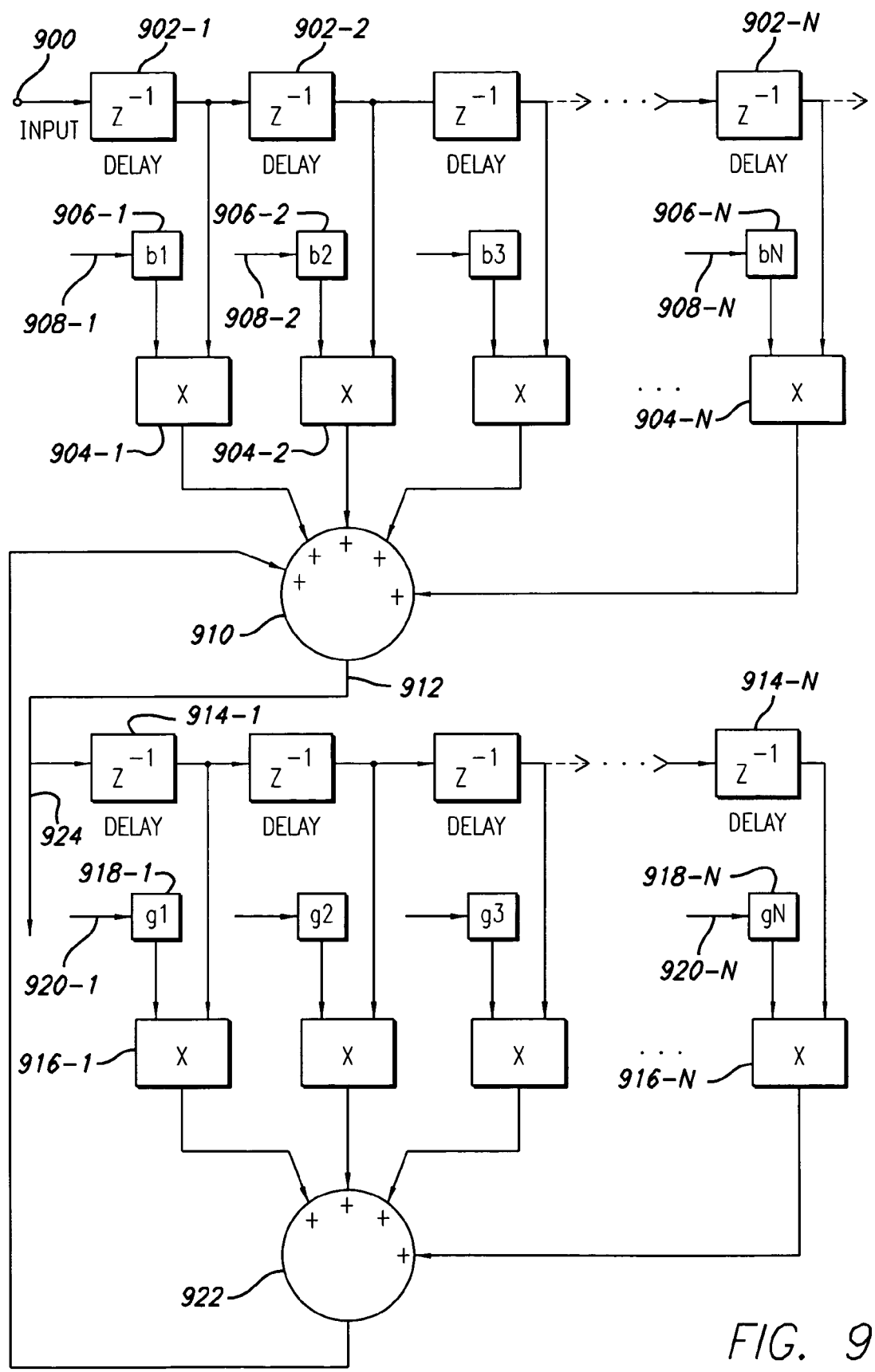
FIG. 9 is a schematic diagram of an IIR filter employed in the autoregressive dynamics compensation block of the digital predistorter of FIG. 3, in accordance with a preferred embodiment of the present invention.

The polynomial digital predistortion circuits 310, 312, 314, 316, 318, 320, and 322 are preferably implemented in FPGA/ASIC technology to provide wide bandwidth on-line predistortion of the digital input signal. Specific implementations of these circuits are shown in FIGS. 7-9, described below. The other circuit components in FIG. 3 are conventional digital circuit components and also may be readily implemented in FPGA/ASIC technology, as will be appreciated by those skilled in the art.

The specific implementation shown in FIG. 3 may be modified to accommodate the specific application and relevant cost and complexity constraints. For example, although FIG. 3 depicts a predistorter that provides up to $5^{th}$ order reactive memory effect compensation only, higher order compensation can be readily implemented by adding additional dynamic memory compensation branches and are also implied herein. Also, in some implementations it may be desirable to have only odd order memory effect compensation, for example to reduce circuit complexity or provide higher than $5^{th}$ odd order correction without additional circuits, and such an embodiment is also implied herein. Also, the manner in which the circuits are cascaded may be varied while retaining the flexible polynomial modeling of the distortion compensation. Additional variations and modifications are also possible as will be appreciated by those skilled in the art.

Figure 4:
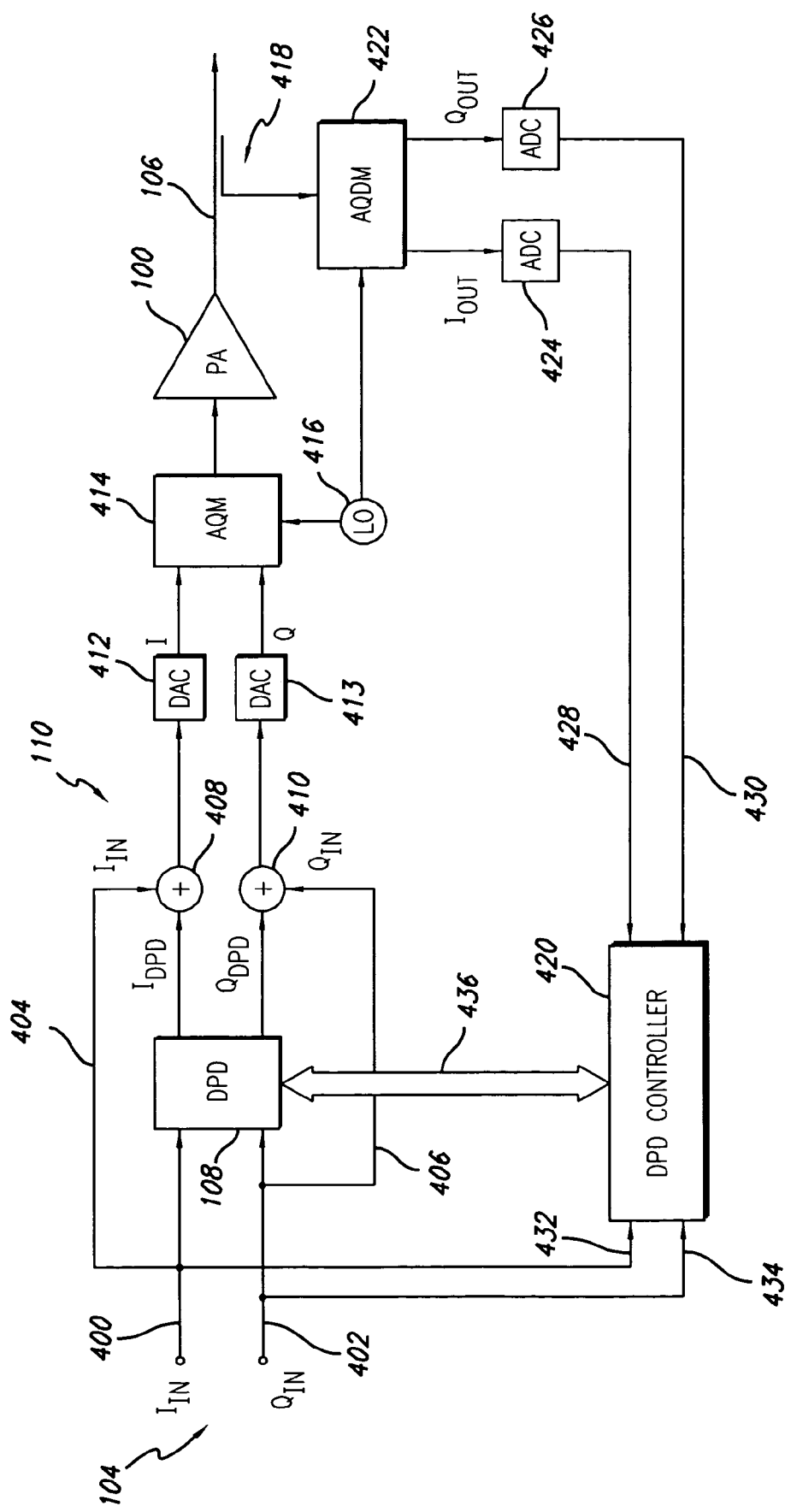
FIG. 4 is a block diagram of an adaptive predistortion linearized amplifier system employing an additive predistortion architecture, in accordance with a preferred embodiment of the present invention.

Referring to FIG. 4 a block diagram of an adaptive predistortion linearized amplifier system employing an additive predistortion architecture is illustrated. The upper signal path in FIG. 4 generally corresponds to FIG. 1A and like numerals are employed for the components described in FIG. 1A. The adaptive system of FIG. 4 adds a lower feedback signal path to the system of FIG. 1A which is coupled to the output 106 and input 104. The adaptive predistortion linearized amplifier system employs a DPD controller 420 in the feedback path which employs the sampled output of the amplifier and the baseband input to generate the polynomial predistortion parameters employed in the DPD 108 (and specifically the predistortion coefficients described above in relation to the preferred embodiment of the DPD described in FIG. 3). This allows the predistortion parameters to be adapted to the current operating conditions of the amplifier system to maximize effectiveness of the predistortion operation and minimize distortion.

More specifically, as shown in FIG. 4 the baseband signal at input 104 is provided to the DPD 108 in quadrature (I,Q) format along lines 400, 402 and is predistorted by the DPD 108 as described above in relation to FIGS. 1A, 1B and 3. The output of DPD 108 is added to the input signal provided on lines 404, 406 at addition circuits 408, 410 (comprising complex addition circuit 110 of FIG. 1A) to form a digital baseband predistorted signal in Cartesian (I,Q) coordinates. The in-phase and quadrature components of the digital baseband predistorted signal are converted into analog signals using digital-to-analog converters (DACs) 412 and 413. The analog signals are then quadrature modulated and up converted to RF using an analog quadrature modulator (AQM) 414 which receives a fixed frequency RF signal from local oscillator (LO) 416. The output of AQM 414 is a predistorted modulated RF carrier. As discussed previously the analog quadrature modulation operation can introduce in-band distortion which is also compensated by DPD 108. The predistorted carrier is used to drive the power amplifier (PA) 100. The output of the amplifier on line 106 is sampled by a sampling coupler 418 and the sampled analog RF signal is down converted and demodulated to an analog I,Q signal by analog quadrature demodulator (AQDM) 422. The up and down conversion processing of the analog signals in the system are phase synchronized by using the same LO 416 for both down conversion and up conversion. The analog I,Q signal from AQDM 422 is converted to I,Q digital signals by analog to digital converters 424, 426 which provide the digital sampled output I,Q signals along lines 428, 430 to DPD controller 420. The digital predistortion (DPD) controller 420 also receives the digital baseband input signal in I,Q format along lines 432, 434. The DPD controller 420 may be a suitably programmed DSP with associated memory. The DPD controller 420 periodically compares the digital baseband input modulation to an estimate of the complex baseband output envelope of the amplifier to adaptively modify the values of the DPD parameters in order to ensure optimum linearity performance when changes in the operating conditions of the amplifier occur (thermal drifts, power supply fluctuations, changes in input modulation, variations in drive level, etc). These updated parameters are provided to the nonvolatile storage locations in DPD 108 as indicated by line 436. The DPD controller 420 can also (optionally) perform spectral analyses of the output envelope estimate to optimize the linearity of the amplifier in different frequency sub-bands.

Figure 5:
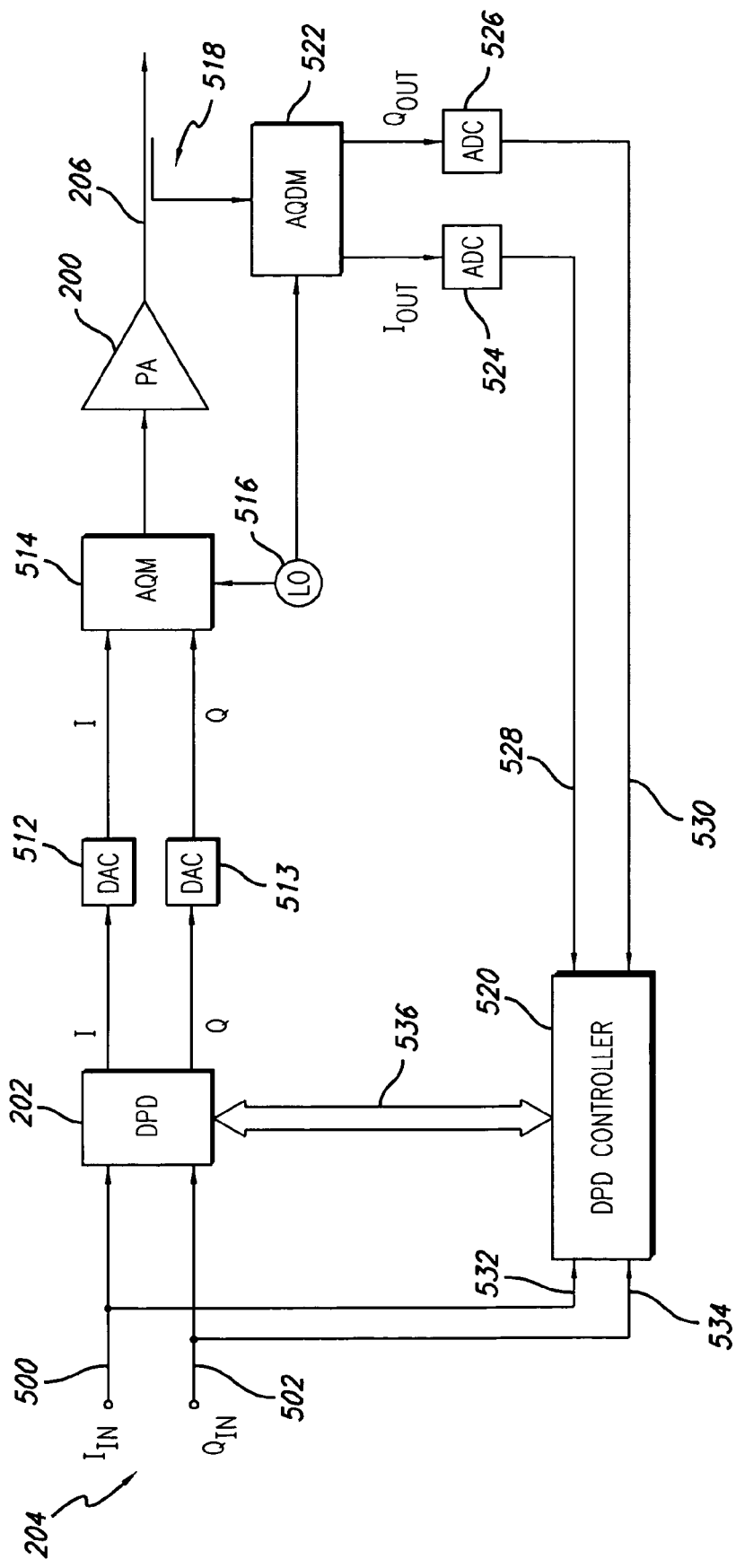
FIG. 5 is a block diagram of an adaptive predistortion linearized amplifier system employing a multiplicative predistortion architecture, in accordance with an alternate embodiment of the present invention.

FIG. 5 shows a block diagram of an adaptive predistortion amplifier system that employs a multiplicative predistortion architecture, in accordance with an alternate embodiment of the invention. The upper path of the system corresponds to the embodiment of FIG. 2A and like numerals are employed for common elements. The adaptive operation of the system is analogous to that described in FIG. 4, the main difference being that the predistorter's topology in FIG. 5 is multiplicative rather than additive as in FIG. 4 with the baseband I,Q input being provided along lines 500, 502 directly to DPD 202 which performs a nonlinear operation on the input signal. The operation of DACs 512, 513, AQM 514, LO 516, sampling coupler 518, AQDM 522, ADCs 524, 526, are the same as like elements in the embodiment of FIG. 4 and need not be described further. The digital predistortion (DPD) controller 520 also similarly receives the digital baseband input signal in I,Q format along lines 532, 534 and the sampled output in digital form on lines 528, 530 and periodically compares the digital baseband input signal to an estimate of the complex baseband output envelope of the amplifier to adaptively modify the values of the DPD parameters. These updated parameters are provided to the storage locations in DPD 202 as indicated by line 536. Although the specific parameter values will differ between the embodiments of FIG. 4 and FIG. 5, due to the flexibility of the polynomial model described in relation to FIG. 3 the same architecture for DPD 108 and 202 may be employed and similarly used in the DPD controllers 420 and 520 to determine the updated parameters.

Figure 6:
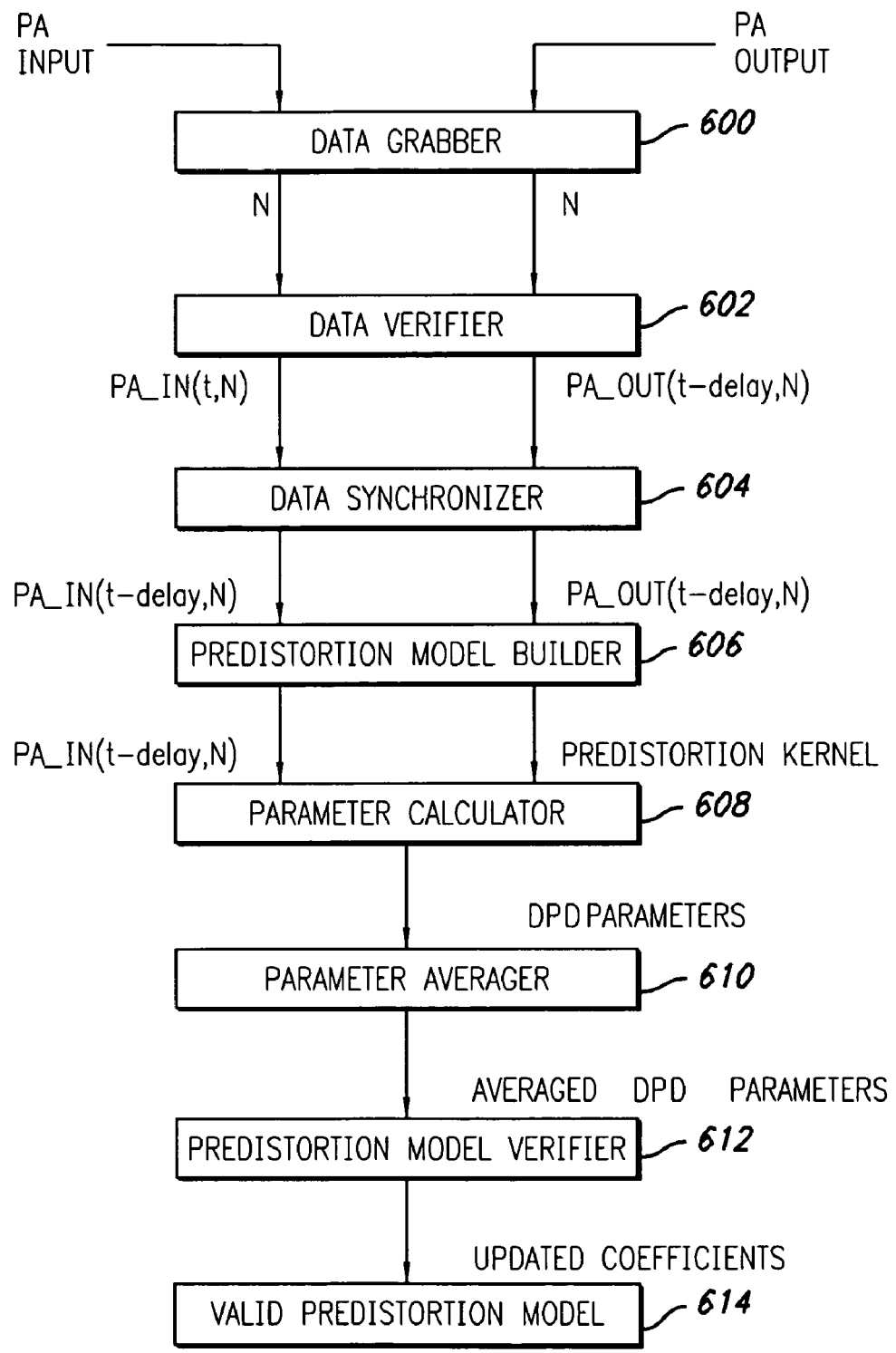
FIG. 6 is a flow diagram of a predistortion adaptation algorithm, in accordance with a preferred embodiment of the present invention.

FIG. 6 shows a flow chart diagram of a preferred embodiment of the predistortion adaptation algorithm implemented in the DPD controller in the adaptive predistortion linearized amplifier systems of FIG. 4 or 5. Estimates of the input signal to the amplifier (PA Input) are generated by a predictive DPD filter inside the DPD controller that operates on the complex baseband quadrature input ($I_{IN}$, $Q_{IN}$). The structure and operation of the predictive DPD filter are identical to those of the DPD described in FIG. 3 above and will not be repeated here. The predicted PA Input signal and the downconverted/digitized complex baseband signal estimate of the output envelope of the amplifier (PA Output) are processed by the data grabber processing block 600 which selects N samples from the estimated PA Input and the PA Output to form the data buffers to be used for DPD adaptation:

$$PA\_IN(t,N)=[PAInput(1) PAInput(2) \ldots PAInput(N)] \quad (9)$$

$$PA\_OUT(t,N)=[PAOutput(1) PAOutput(2) \ldots PAOutput(N)] \quad (10)$$

The data verifier processing block 602 then determines whether the samples selected by the data grabber are suitable for the computation of new predistortion parameters. One verification criteria implemented in the data verifier block 602 is to test if the crest factor (CF) of the grabbed PA Input data exceeds a preset threshold $CF_{thres}$:

$$CF = \frac{\max(|PA\_IN(t, N)|^2)}{Avg(|PA\_IN(t, N)|^2)} > ? CF_{thres} \quad (11)$$

If this condition is true, the data is verified as good then it is presented to the data synchronizer processing block 604 which uses fractional delay interpolation techniques to time-align the input and output data in order to compensate for amplifier and processing delays. Proper time synchronization is an important requirement for ensuring the accuracy of memory effect compensation in the DPD. The time-aligned input (PA_IN(t-delay,N)) and output (PA_OUT(t-delay,N)) data buffers are then processed by the predistortion model builder processing block 606 which uses the synchronized data to compute a kernel matrix K that implements in software the DPD structure shown in FIG. 3:

$$K = f(PA\_OUT(t - delay, N)) = \begin{bmatrix} \text{Linear} & \text{NonLinear} & \text{NonLinear} \\ \text{Dynamic} & \text{Dynamic} & \text{Static} \\ \text{Terms} & \text{Terms} & \text{Terms} \end{bmatrix} \quad (12)$$

The parameter calculator processing block 608 then uses the kernel matrix and the synchronized input data PA_IN(t-delay,N) to compute the predistorter's parameters. The parameter calculator processing block 608 preferably uses fast convergence least square processing to find an optimal set of parameter values that minimize the quadratic norm squared (average power) of the output distortion of the amplifier. The DPD parameters are low-pass filtered in the parameter averager processing block 608 to reduce the effects of noise and disturbances in the computation of the DPD parameters. Finally the predistortion model validator processing block 612 checks the consistency and validity of the parameter values computed by the parameter calculator 608 and averaged by the parameter averager 610. One model validation criteria implemented in model validator 612 is to test if the magnitude of the DPD parameters is within preset bounds. If this condition is true, the parameter values are considered valid and they are provided as updated predistortion coefficients to the DPD (108 or 202). The predistortion model validator block 614 also keeps a table of previously computed predistortion coefficients that can be used in case that the most recently computed parameters estimates are invalid or do not provide acceptable predistortion performance.

Referring to FIG. 7 a preferred embodiment of a FIR filter which may be employed for dynamics compensation circuits 310, 314, 316, 318, and 320 described in relation to FIG. 3 above is illustrated in a schematic drawing. The same basic architecture illustrated in FIG. 7 may be employed for each of the circuits with the filter coefficients varying between the specific circuits. Also, the number of filter stages N may vary in the implementations of the individual circuits of FIG. 3. As shown, the FIR filter receives the digital input at input 700 which will correspond to the complex input samples for the linear dynamics compensation circuit 310 and to various orders of the input envelope samples in the circuits 314, 316, 318 and 320. The digital input signal at 700 is provided to a series of delay stages 702 equal in number to the desired filter size. The output of each delay stage 702 has a tap which is fed to a multiplier 704 which also receives a complex parameter (or filter coefficient) stored in nonvolatile memory 706. These individual filter coefficients are updated by the DPD controller along lines 708 in the adaptive embodiments described previously. The outputs of the N multipliers 704 are fed to a complex addition circuit 710 which provides a complex filter output on line 712.

Referring to FIG. 8 a preferred embodiment of a polynomial generator circuit which may be employed for the nonlinear static compensation circuit 312 of FIG. 3, is illustrated in a schematic drawing. As shown the polynomial generator circuit has an input 800 which receives the digital envelope signal (as described above in relation to FIG. 3) which is fed to a first multiplier circuit 802 which also receives a complex polynomial coefficient from nonvolatile storage 804. The polynomial coefficient stored in nonvolatile storage 804 may be updated by the DPD controller along line 805 in an adaptive embodiment as described previously. The output of the multiplier 802 is provided along line 806 to a complex addition circuit 810. The output of the multiplier 802 is also provided along 808 to a second branch of the polynomial generator circuit which includes multipliers 812 and 814 and a nonvolatile storage 816 which stores a second complex polynomial coefficient. Similarly this complex polynomial coefficient may be updated as indicated by line 817 from the DPD controller. The output of multiplier 814 is provided to addition circuit 810. A third branch of the polynomial generator is provided via multiplier 818. Additional branches of the polynomial generator circuit are cascaded in a manner as illustrated in FIG. 8 until a final branch including a final polynomial coefficient in nonvolatile storage 828 and multipliers 824 and 826 provides a final $N^{th}$ order complex polynomial value to addition circuit 810. The output of addition circuit 810 is provided on line 820 and generally corresponds to the polynomial of equation (2) above.

Referring to FIG. 9 a preferred embodiment of the autoregressive dynamics compensation circuit 322 is illustrated in a schematic drawing. The circuit illustrated corresponds to an IIR filter providing both zeros and poles in the filter transfer function and accordingly corresponds generally to the implementation of equation (8) described above. In an all pole implementation corresponding to equation (7) the lower half of the circuit may be employed with the input corresponding to the signal on line 912. The digital input signal at 900 is provided to a series of delay stages 902 equal in number to the desired number of filter stages implemented in the numerator of equation (8). The output of each delay stage 902 has a tap which is fed to a multiplier 904 which also receives a complex parameter (or filter coefficient) stored in nonvolatile memory 906. These individual filter coefficients are updated by the DPD controller along lines 908 in the adaptive embodiments described previously. The outputs of the N multipliers 904 are fed to a complex addition circuit 910 which provides a complex output on line 912. The output on line 912 acts as an input to the all pole section of the filter. The signal on line 912 is provided to a second series of delay stages 914 equal in number to the desired number of filter stages implemented in the denominator of equation (8), or in equation (7) in an all pole implementation of circuit 322. The output of each delay stage 914 has a tap which is fed to a multiplier 916 which also receives a complex parameter (or filter coefficient) stored in nonvolatile memory 918. These individual filter coefficients are updated by the DPD controller along lines 920 in the adaptive embodiments described previously. The outputs of the N multipliers 916 are fed to a complex addition circuit 922 which provides a complex output to addition circuit 910 which provides an output from the filter on line 924 via line 912. The number of stages in the upper and lower sections of the filter, while indicated by the integer N, may in general be different.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. A digital predistorter for an amplifier system, comprising:
    an input for receiving a digital communication signal comprising a stream of signal samples;
    a linear dynamic compensation circuit coupled to the input and providing a linear operation on a plurality of time delayed signal samples;
    a digital envelope detector coupled to the input and providing a stream of discrete digital envelope signal samples corresponding to the input signal samples;
    a first nonlinear dynamic compensation circuit coupled to the envelope detector and providing a nonlinear operation on a plurality of delayed envelope signal samples;
    a second nonlinear dynamics compensation circuit coupled in a cascade arrangement with the first nonlinear dynamic compensation circuit and providing an autoregressive operation on plural samples of the output of the first nonlinear dynamic compensation circuit; and
    a combiner for combining the outputs of the linear dynamics compensation circuit and the second nonlinear dynamics compensation circuit and providing a digital predistortion signal as an output.

2. A digital predistorter as set out in claim 1, further comprising a nonlinear static compensation circuit coupled to the envelope detector in parallel with the first nonlinear dynamics compensation circuit and providing a nonlinear operation on individual digital envelope signal samples.

3. A digital predistorter as set out in claim 2, wherein said second nonlinear dynamics compensation circuit is coupled in series with the nonlinear static compensation circuit and performs said autoregressive operation on the combined outputs of the nonlinear static compensation circuit and the first nonlinear dynamics compensation circuit.

4. A digital predistorter as set out in claim 1, wherein said linear dynamics compensation circuit comprises a finite impulse response filter.

5. A digital predistorter as set out in claim 1, wherein said first nonlinear dynamics compensation circuit comprises a plurality of finite impulse response filters coupled in a parallel configuration.

6. A digital predistorter as set out in claim 5, further comprising a plurality of multipliers coupled to said envelope detector and wherein said plurality of finite impulse response filters are coupled to respective multiplier outputs and operate on plural higher order envelope samples.

7. A digital predistorter as set out in claim 6, wherein said plural finite impulse response filters respectively operate on at least second, third, fourth and fifth order envelope samples.

8. A digital predistorter as set out in claim 1, wherein said second nonlinear dynamics compensation circuit comprises an infinite impulse response filter.

9. A digital predistorter as set out in claim 2, wherein said nonlinear static compensation circuit comprises a polynomial generator providing a weighted polynomial from each individual envelope sample.

10. A digital predistorter as set out in claim 9, wherein said polynomial generator comprises a plurality of multipliers receiving said individual envelope samples and creating higher order envelope samples, a plurality of circuits providing complex coefficients to said multipliers and a summing circuit for combining the plural weighted higher order envelope samples.

11. A digital predistorter as set out in claim 1, further comprising a complex multiplier coupled to the input and the output of the second nonlinear dynamics compensation circuit and multiplying said input samples and the output of the second nonlinear dynamics compensation circuit and providing the multiplied value to said combiner.

12. A predistortion linearized amplifier system, comprising:
    an input for receiving a digital communication signal comprising a stream of signal samples;
    a first signal path coupled to the input;
    a second signal path comprising a digital predistorter, the digital predistorter comprising a linear polynomial predistortion circuit operating on plural delayed samples of the input signal and a nonlinear polynomial predistortion circuit coupled to the input in parallel with said linear polynomial predistortion circuit, said nonlinear polynomial predistortion circuit comprising a finite impulse response filter circuit and infinite impulse response filter coupled in series, and a combiner for combining the outputs of the linear and nonlinear polynomial predistortion circuits and providing a predistortion signal;
    an addition circuit coupled to the first and second signal paths and adding the input signal and the predistortion signal and outputting a predistorted input signal; and
    an amplifier receiving and amplifying the predistorted input signal and providing an amplified output signal.

13. A predistortion linearized amplifier system as set out in claim 12, further comprising a digital to analog converter coupled between the addition circuit and the amplifier for converting the predistorted input signal from digital to analog form.

14. A predistortion linearized amplifier system as set out in claim 12, wherein said linear polynomial predistortion circuit comprises a finite impulse response filter.

15. A predistortion linearized amplifier system as set out in claim 12, wherein said nonlinear polynomial predistortion circuit further comprises a digital envelope detector coupled to the input and providing a stream of envelope samples to said finite impulse response filter circuit and wherein said finite impulse response filter circuit operates on plural delayed envelope samples with plural complex coefficients.

16. A predistortion linearized amplifier system as set out in claim 15, wherein said finite impulse response filter circuit comprises a bank of finite impulse response filters coupled in parallel and operating on plural different orders of the stream of envelope samples.

17. A predistortion linearized amplifier system as set out in claim 15, wherein said nonlinear polynomial predistortion circuit further comprises a static nonlinear polynomial circuit coupled to said envelope detector in parallel with said finite impulse response filter circuit and generating a complex weighted polynomial from individual envelope samples.

18. A predistortion linearized amplifier system as set out in claim 17, wherein said nonlinear polynomial predistortion circuit further comprises a second combiner coupled to and combining the outputs of the finite impulse response filter circuit and static nonlinear polynomial circuit and wherein said infinite impulse response filter is coupled to the output of the second combiner.

19. A predistortion linearized amplifier system as set out in claim 18, wherein said nonlinear polynomial predistortion circuit further comprises a multiplier coupled to the input and the infinite impulse response circuit and multiplying the input signal samples and the output of the infinite impulse response filter and providing the multiplied output to the combiner.

20. A predistortion linearized amplifier system, comprising:
an input for receiving a digital communication signal comprising a stream of signal samples;
a digital predistorter, the digital predistorter comprising a linear polynomial predistortion circuit operating on plural delayed samples of the input signal and a nonlinear polynomial predisortion circuit coupled to the input in parallel with said linear polynomial predistortion circuit, said nonlinear polynomial predistortion circuit comprising a finite impulse response filter circuit and an infinite impulse response filter coupled in series, and a combiner for combining the outputs of the linear and nonlinear polynomial predistortion circuits and providing a predistorted input signal; and
an amplifier receiving and amplifying the predistorted input signal and providing an amplified output signal.

21. A predistortion linearized amplifier system as set out in claim 20, further comprising a digital to analog converter coupled between the digital predistorter and the amplifier for converting the predistorted input signal from digital to analog form.

22. A predistortion linearized amplifier system as set out in claim 20, wherein said linear polynomial predistortion circuit comprises a finite impulse response filter.

23. A predistortion linearized amplifier system as set out in claim 20, wherein said nonlinear polynomial predistortion circuit further comprises a digital envelope detector coupled to the input and providing a stream of envelope samples to said finite impulse response filter circuit and wherein said finite impulse response filter circuit operates on plural delayed envelope samples with plural complex coefficients.

24. A predistortion linearized amplifier system as set out in claim 23, wherein said finite impulse response filter circuit comprises a bank of finite impulse response filters coupled in parallel and operating on plural different orders of the stream of envelope samples.

25. A predistortion linearized amplifier system as set out in claim 23, wherein said nonlinear polynomial predistortion circuit further comprises a static nonlinear polynomial circuit coupled to said envelope detector in parallel with said finite impulse response filter circuit and generating a complex weighted polynomial from individual envelope samples.

26. A predistortion linearized amplifier system as set out in claim 25, wherein said nonlinear polynomial predistortion circuit further comprises a combiner coupled to and combining the outputs of the finite impulse response filter circuit and static nonlinear polynomial circuit and wherein aid infinite impulse response filter is coupled to the output of the second combiner.

27. A predistortion linearized amplifier system as set out in claim 26, wherein said nonlinear polynomial predistortion circuit further comprises a multiplier coupled to the input and the infinite impulse response circuit and multiplying the input signal samples and the output of the infinite impulse response filter and providing the multiplied output to the combiner.

28. An adaptive predistortion linearized amplifier system, comprising:
an input receiving a digital communication signal comprising a stream of signal samples;
a polynomial based predistortion circuit receiving and operating on said input signal samples and providing a stream of predistorted input samples, said polynomial based predistortion circuit comprising a first finite impulse response filter employing a first set of adaptive complex coefficients, a second finite impulse response filter circuit employing a second set of adaptive complex coefficients, and an infinite impulse response filter circuit employing a third set of adaptive complex coefficients;
a digital to analog converter receiving the predistorted input samples and providing an analog predistorted input signal;
an amplifier receiving and amplifying said analog predistorted input signal to provide an output signal;
a sampling coupler coupled to the amplifier output and providing a sampled output signal;
an analog to digital converter coupled to said sampling coupler and providing a digital sampled output signal; and
an adaptive controller coupled to receive the digital sampled output signal and to the input to receive the input samples, the controller generating said first, second and third adaptive complex coefficients and providing them to said polynomial based predistortion circuit.

29. An adaptive predistortion linearized amplifier system as set out in claim 28, wherein said adaptive controller generates said first, second and third adaptive complex coefficients employing first, second and third polynomial operations on said digital sampled output signal.

30. An adaptive predistortion linearized amplifier system as set out in claim 29, wherein said adaptive controller comprises a programmed digital signal processor implementing said first, second and third polynomial operations.

31. An adaptive predistortion linearized amplifier system as set out in claim 28, wherein said polynomial based predistortion circuit is coupled in series between said input and said digital to analog converter.

32. An adaptive predistortion linearized amplifier system as set out in claim 28, wherein said polynomial based predistortion circuit is coupled in a second signal path between said input and said digital to analog converter in parallel with a first signal path and wherein said first and second signal paths are coupled by a combiner.

33. An adaptive predistortion linearized amplifier system as set out in claim 32, wherein said combiner comprises a complex addition circuit.

34. An adaptive predistortion linearized amplifier system as set out in claim 28, further comprising an analog quadrature modulator coupled between the digital to analog converter and the amplifier input.

35. An adaptive predistortion linearized amplifier system as set out in claim 34, further comprising an analog quadrature demodulator coupled between said sampling coupler and said analog to digital converter.

36. An adaptive predistortion linearized amplifier system as set out in claim 35, further comprising a local oscillator coupled to said analog quadrature modulator and said analog quadrature demodulator for upconverting and downconverting, respectively, the analog signals input to said modulators.

37. A method for predistorting a communication signal prior to amplification by an RF amplifier to achieve an improved linearity in the amplified signal, comprising:
receiving a digital communication signal comprising a stream of signal samples;
predistorting the digital communication signal employing a discrete-time polynomial model of the inverse transfer characteristic of the amplifier to provide a predistorted communication signal, said polynomial model providing separate and simultaneous compensation for nonlinear static distortion, linear dynamic distortion and nonlinear dynamic distortion effects of the amplifier, wherein said compensation for nonlinear dynamic distortion comprises providing separate compensation for electrical memory effects of the amplifier and thermal memory effects; and
outputting the predistorted communication signal to be amplified by the amplifier.

38. A method for predistorting a communication signal as set out in claim 37, wherein said predistorting the digital communication signal comprises adding a predistortion signal to said stream of input samples to provide said predistorted communication signal.

39. A method for predistorting a communication signal as set out in claim 37, wherein said predistorting the digital communication signal comprises operating on said stream of input samples with plural parallel polynomial operations to provide said predistorted communication signal.

40. A method for predistorting a communication signal as set out in claim 37, wherein said compensation for linear dynamic distortion comprises filtering plural input samples employing a finite impulse response filter.

41. A method for predistorting a communication signal as set out in claim 37, wherein said compensation for nonlinear static distortion comprises performing a polynomial operation on individual input envelope samples.

42. A method for predistorting a communication signal prior to amplification by an RF amplifier to achieve an improved linearity in the amplified signal, comprising:
receiving a digital communication signal comprising a stream of signal samples;
predistorting the digital communication signal employing a discrete-time polynomial model of the inverse transfer characteristic of the amplifier to provide a predistorted communication signal, said polynomial model providing separate and simultaneous compensation for nonlinear static distortion, linear dynamic distortion and nonlinear dynamic distortion effects of the amplifier, wherein said compensation for nonlinear dynamic distortion comprises filtering a signal derived from plural input samples employing a finite impulse response filter cascaded with an infinite impulse response filter; and
outputting the predistorted communication signal to be amplified by the amplifier.

43. A method for adaptive predistortion linearization of an RF amplifier system, comprising:
receiving a digital communication signal comprising a stream of signal samples;
operating on said input signal samples with a plurality of separate polynomial based operations and providing a stream of predistorted input samples, said polynomial based operations comprising a first finite impulse response filtering operation employing a first set of adaptive complex coefficients, a second finite impulse response filtering operation employing a second set of adaptive complex coefficients, and an infinite impulse response filtering operation employing a third set of adaptive complex coefficients;
providing an analog predistorted RF input signal from the predistorted input samples;
amplifying said analog predistorted RF input signal to provide an output signal;
sampling the amplifier output signal and providing an analog sampled output signal;
converting said analog sampled output signal to a digital sampled output signal; and
generating updated adaptive complex coefficients employing the digital sampled output signal and the input signal samples and employing the updated coefficients for said polynomial based predistortion operations.

44. A method for adaptive predistortion linearization of an RF amplifier system, as set out in claim 43, wherein operating on said input signal samples with a plurality of separate polynomial based operations and providing a stream of predistorted input samples comprises adding a predistortion signal to said stream of input samples to provide said stream of predistorted input samples.

45. A method for adaptive predistortion linearization of an RF amplifier system, as set out in claim 43, wherein operating on said input signal samples with a plurality of separate polynomial based operations and providing a stream of predistorted input samples comprises operating on said stream of input samples with plural parallel polynomial operations to provide said stream of predistorted input samples.

46. A method for adaptive predistortion linearization of an RF amplifier system as set out in claim 43, wherein said first finite impulse response filtering operation and said infinite impulse response filtering operation are performed in series.

47. A method for adaptive predistortion linearization of an RF amplifier system as set out in claim 46, wherein said second finite impulse response filtering operation and said infinite impulse response filtering operation are performed in series.

48. A method for adaptive predistortion linearization of an RF amplifier system, as set out in claim 43, wherein operating on said input signal samples with a plurality of separate polynomial based operations comprises deriving a stream of envelope samples from said input signal samples and operating on said stream of envelope samples.

49. A method for adaptive predistortion linearization of an RF amplifier system, as set out in claim 48, wherein operating on said input signal samples with a plurality of separate polynomial based operations further comprises performing a polynomial operation on individual envelope samples.

* * * * *